(12) United States Patent
Younsi et al.

(10) Patent No.: US 7,579,843 B2
(45) Date of Patent: Aug. 25, 2009

(54) METHODS AND APPARATUS FOR ANALYZING PARTIAL DISCHARGE IN ELECTRICAL MACHINERY

(75) Inventors: Abdelkrim Younsi, Ballston Lake, NY (US); Sameh Ramadan Salem, Rexford, NY (US)

(73) Assignee: General Electric Company, Schenectady, NY (US)

( * ) Notice: Subject to any disclaimer, the term of this patent is extended or adjusted under 35 U.S.C. 154(b) by 261 days.

(21) Appl. No.: 11/549,430

(22) Filed: Oct. 13, 2006

(65) Prior Publication Data

US 2008/0088314 A1 Apr. 17, 2008

(51) Int. Cl.
G01R 29/12 (2006.01)
G01R 31/02 (2006.01)
H01H 31/12 (2006.01)

(52) U.S. Cl. .................. 324/458; 324/536; 324/547; 324/551; 324/613

(58) Field of Classification Search .................. 324/458, 324/536, 547, 551, 613
See application file for complete search history.

(56) References Cited

U.S. PATENT DOCUMENTS

| | | | |
|---|---|---|---|
| 5,214,595 A * | 5/1993 | Ozawa et al. ............... | 324/536 |
| 5,323,117 A | 6/1994 | Endoh et al. | |
| 5,469,067 A | 11/1995 | Endoh et al. | |
| 5,475,312 A * | 12/1995 | Sedding et al. ............. | 324/536 |
| 5,506,511 A * | 4/1996 | Nilsson et al. .............. | 324/536 |
| 5,642,038 A * | 6/1997 | Kim et al. ................... | 324/536 |
| 5,854,556 A | 12/1998 | Steennis et al. | |
| 5,903,220 A | 5/1999 | Jon et al. | |
| 5,991,137 A | 11/1999 | Krahn et al. | |
| 6,161,077 A | 12/2000 | Fawcett | |
| 6,192,317 B1 * | 2/2001 | Yazici et al. ................ | 324/536 |
| 6,285,538 B1 | 9/2001 | Krahn | |
| 6,297,642 B1 | 10/2001 | Shibahara et al. | |
| 6,313,640 B1 * | 11/2001 | Nasrallah et al. ............ | 324/536 |
| 6,345,236 B1 | 2/2002 | Bertheau et al. | |
| 7,076,404 B2 * | 7/2006 | Freisleben et al. .......... | 702/196 |
| 7,112,968 B1 | 9/2006 | Nishizawa | |
| 2006/0164100 A1 | 7/2006 | Moriyama et al. | |

* cited by examiner

Primary Examiner—Timothy J Dole
(74) Attorney, Agent, or Firm—Armstron Teasdale LLP (57) ABSTRACT

Methods and apparatus for analyzing electrical insulation of an electrical machine are provided. The method includes receiving a first signal that includes a plurality of partial discharge pulses from the electrical machine and a plurality of noise pulses, receiving other signals that includes information relative to at least one process parameter associated with the electrical machine, determining the plurality of partial discharge pulses from the plurality of noise pulses, identifying characteristics of the plurality of partial discharge pulses relating to the location and character of partial discharges in the electrical machine, and determining a condition of the electrical insulation using the identified characteristics and the received information relative to at least one process parameter.

20 Claims, 6 Drawing Sheets

METHODS AND APPARATUS FOR ANALYZING PARTIAL DISCHARGE IN ELECTRICAL MACHINERY

BACKGROUND OF THE INVENTION

This invention relates generally to electrical machinery condition assessment analyzers and more particularly, to methods and analyzer systems for assessing partial discharge (PD) in machinery.

Partial discharge events in an insulation system are a pulse release of energy that propagates out from its site of origin. The propagation occurs according to the structure surrounding the partial discharge event. An internally generated partial discharge pulse propagates and appears at the end regions, such as a high or low voltage bushing, as specific pulse waves in accordance with the structure, the location of the origin of the pulse, and the pulse characteristic itself. Although partial discharge analysis has been used for many years on various electrical equipment, noise recognition/cancellation and data interpretation remain difficult. It is important to separate noise from true partial discharge data. It is also important to be able to identify and locate partial discharge activity sources. At least some known analyzer systems use a time of flight approach towards noise cancellation. Other known analyzer systems use a more basic, less efficient gating approach. However, such approaches are deficient in removing noise from partial discharge signals and do not allow for differing partial discharge response based on differing operating and environmental conditions ambient to the machine and/or insulation system.

BRIEF DESCRIPTION OF THE INVENTION

In one embodiment, a method of analyzing electrical insulation of an electrical machine includes receiving a first signal that includes a plurality of partial discharge pulses from the electrical machine and a plurality of noise and external pulses, receiving a second signal that includes information relative to at least one process parameter associated with the electrical machine, determining the plurality of partial discharge pulses from the plurality of noise and external pulses, identifying characteristics of the plurality of partial discharge pulses relating to the location and character of partial discharges in the electrical machine, and determining a condition of the electrical insulation using the identified characteristics and the received information relative to at least one process parameter.

In another embodiment, an apparatus for on-line location of partial discharge events in an AC power system during operation of the system includes a coupler adapted to couple to the AC power system and responsive to the voltage on the AC power system, coupler further adapted to detect high frequency electromagnetic pulses in the AC power system generated by partial discharge events, and an analyzer system adapted to receive a first signal representative of the detected high frequency electromagnetic pulses and a second signal representative of a process parameter associated with the AC power system during operation of the system, the analyzer system further adapted to determine a location of partial discharge events in the power system using the first and second signals.

In yet another embodiment, an electrical machine monitoring system includes a coupler adapted to couple to the AC power system and responsive to the voltage on the AC power system, the coupler further adapted to detect high frequency electromagnetic pulses in the AC power system generated by at least partial discharge events and to output a first signal representative of the high frequency electromagnetic pulses, a data acquisition system adapted to acquire an input from at least one process parameter sensor associated with at least one of the operation and ambient environment of the AC power system and to output a second signal representative of the at least one process parameter sensor, and an analyzer system adapted to receive the first signal and the second signal, the analyzer system further adapted to determine a location of partial discharge events in the power system using the first and second signals.

DETAILED DESCRIPTION OF THE INVENTION

Figure 1:
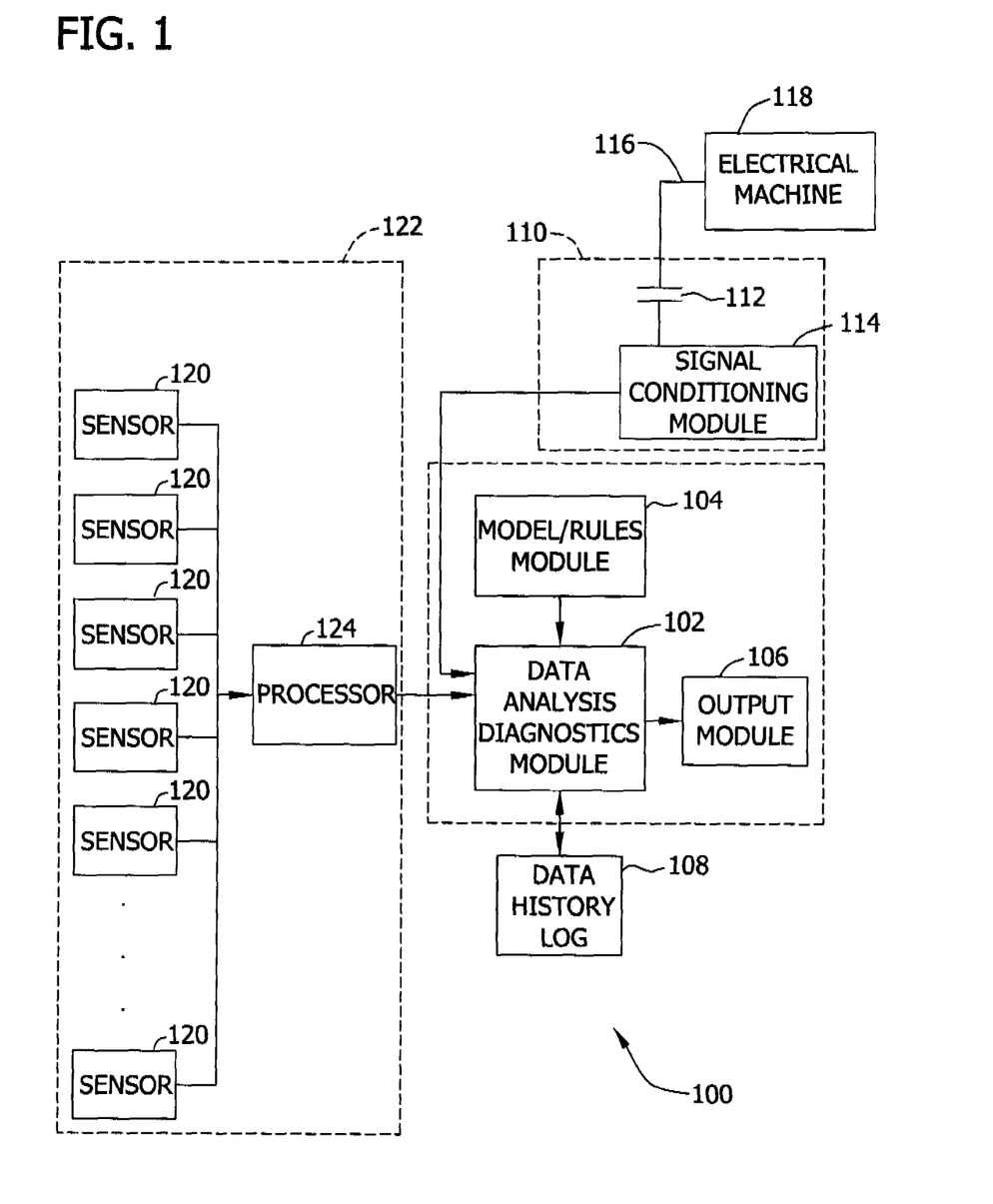
FIG. 1 is a schematic block diagram of an on-line real-time partial discharge analyzer system in accordance with an exemplary embodiment of the present invention.

FIG. 1 is a schematic block diagram of an on-line real-time partial discharge analyzer system 100 in accordance with an exemplary embodiment of the present invention. Partial discharge pulses are recorded using analyzer system 100, which is capable of collecting PD pulses at up to about 100 MHz bandwidth. In the exemplary embodiment, analyzer system 100 includes a data analysis and diagnostics module 102, a model/rules module 104, and an output module 106. A data history log 108 in one embodiment is a data logger associated with a process plant distributed control system (DCS) and may not form a portion of analyzer system 100. In an alternative embodiment, data history log 108 is a module of analyzer system 100.

Data analysis and diagnostics module 102 is communicatively coupled to a partial discharge sensor 110 that includes a coupler 112 and a signal conditioning module 114. Coupler 112 is generally electrically coupled to a power lead or bus 116 coupled to a device of interest, such as an electrical machine 118. Several different types of couplers may be used, for example, an epoxy mica coupler (EMC), antennas, and radio frequency current transformer (RFCT). Analyzer system 100 uses one sensor per phase.

Data analysis and diagnostics module 102 is also communicatively coupled to a plurality of process parameter sensors 120 through a plant data acquisition system 122 that includes a processor 124. Process parameter sensors 120 are coupled to various process parameters and parameters associated with the environment surrounding machine 118. Such process parameters include but are not limited to, bus voltage, bus current, machine real power, machine reactive power, temperature of windings, oil and/or hydrogen depending on the type of machine, machine vibration, a stator leak monitoring system (SLMS), flux probes, ozone, hydrocarbon concentration, protecting relaying device alarms, neutral current and voltage, field ground detector, hydrogen pressure, and combinations thereof. The environmental parameters include but are not limited to, ambient temperature, ambient humidity, atmospheric pressure, and combinations thereof. Parameters derived or calculated from other parameters may also be transmitted to data analysis and diagnostics module 102. Ozone detected in a machine indicates the presence of external corona activity. An increase of PD with ozone levels indicates external PD. A finer interpretation of PD plots based on phase and pulse shape can help confirm surface or bulk PD. Humidity can cause a seasonal variation in PD levels on air cooled generators. Knowing the relative humidity (RH) level facilitates interpreting trends over time and avoids false diagnostics, Winding temperature changes with load affect both bulk and surface PD. Knowing temperature/PD values and trends helps in identifying whether PD sources are located in the bulk of the insulation or at the surface of the winding bars.

During operation, coupler 112 is configured to receive high frequency pulses transmitted through bus 116. The high frequency pulses include noise pulses and partial discharge pulses generated in machine 118 and other equipment coupled to bus 116, for example, support insulators, a transformer or a motor (both not shown). When electrical machine 118 is in operation, high-frequency noise is generated by electrical machine 118 itself and surrounding devices, and pulses of the high-frequency noise are detected by partial discharge sensor 110.

Partial discharges are pulse events with a sudden localized redistribution of charge in or on high voltage insulating materials at relatively high electric stress. The partial discharge events are frequently an indicator of failure processes that are active within or on the insulation. A partial discharge and the reversal of charge that occurs in connection with it show as a current pulse in the connectors of the insulating material. In practice, these current pulses also sum into the phase voltage of the system. Characteristics of partial discharges can be divided into two groups as follows: properties of a single partial discharge pulse, such as shape and charge, and properties of a partial discharge pulse group, such as pulse repetition frequency and pulse occurrence areas. Different partial discharge types have different partial discharge characteristics. Using these characteristics, it is possible to identify different partial discharge types and the cause of the partial discharge.

The pulse discharge event itself is typically of a very short duration. That is, the redistribution of charge, and hence pulse currents, associated with partial discharge events typically occur in the sub-microsecond time scale. Time duration values of 10 nanoseconds (10-8) and less can also occur.

Data analysis and diagnostics module 102 receives the high frequency electromagnetic pulses generated by the partial discharge events, and receives a reference voltage indicative of the power signal on bus 116. Data analysis and diagnostics module 102 analyzes the phase angle of the partial discharge signals versus the reference voltage and the shape of the pulses from the partial discharge events and noise. Data analysis and diagnostics module 102 separates the noise from the partial discharge events and analyzes the pulses associated with the partial discharge events to determine the pulse origination location and character by applying rules and model features stored in model/rules module 104. Character of the partial discharge events include an apparent severity of the partial discharge events that may for example, be related to the charge dissipated during the event or to the local current flowing as a result of the partial discharge event. The rules include threshold ranges for characteristics associated with known pulses from various locations within similar machines in a fleet of machines, and also include machine operating and environmental parameters that may affect the partial discharge pulse shape characteristics. The characteristics of known pulses from the fleet of similar machines are stored in, for example, data history log 108. Analyzer system 100 acquires data and simultaneously time-stamps and stores the data in a memory such as data history log 108. When analyzer system 100 processes the data the time stamp is used to correlate data received at various times in the past and also to correlate data collected on a different analyzer system. Data files are transferred between different analyzer systems to facilitate establishing a large inventory of pulse characteristics that can then be used for comparison and validation. Rules are generated from the characteristics of known pulses and applied to the received pulses to determine the location and character of the partial discharge associated with the received pulses. Similarly, modeled pulses may be determined and stored in data history log 108 for particular configurations of components in a machine that does not have a history of known pulses associated with partial discharge events. For example, a new model generator or transformer may not have sufficient operating history to develop a database of known partial discharge pulses. Rather, the configuration is modeled and characteristics of modeled pulses are used to determine partial discharge locations and character.

Results of the analysis are transmitted to output 106, where it may be further processed and displayed to a user. Output 106 displays results indicative of machine aging behavior including trends of machine 118 and comparisons to other machine in the fleet. Output 106 also displays results indicative of service demand of machine 118 including recommended service to prolong the service life of machine 118, risk assessment of continued operation with and without service, and action recommendations when analyzer system 100 determines that a failure is eminent or likely to occur before the next service interval.

Figure 2:
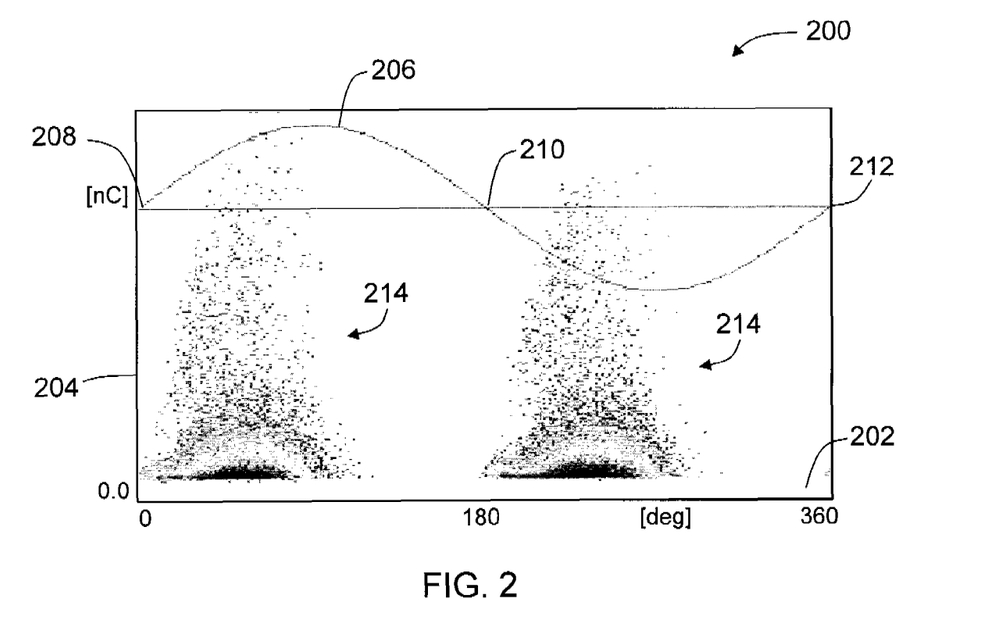
FIG. 2 is a graph of a partial discharge (PD) pulse amplitude vs. phase of occurrence for pulses that may be detected using the analyzer system shown in FIG. 1.

FIG. 2 is a graph 200 of partial discharge (PD) pulse amplitude vs. phase of occurrence for pulses that may be detected using analyzer system 100 (shown in FIG. 1). Such a phase-resolved PD pattern (PRPD pattern) illustrates information about partial discharge pulse height and phase distribution. Graph 200 includes an x-axis 202 graduated in units of degrees and a y-axis 204 graduated in units of voltage indicating a magnitude of a received high frequency pulse. A trace 206 indicates a relative magnitude of supply/generated voltage to an electrical machine being monitored. At each zero crossing 208, 210, 212, when voltage increases in the positive or negative direction, stresses build in the insulation and partial discharges 214 are generated based on the condition of the insulation, operating conditions, and environmental conditions proximate the machine. Typically, the pulses include pulses from partial discharge within the machine, pulses from partial discharge from devices coupled to the power supply that are external to the machine, and noise pulses. In the exemplary representation, determining true partial discharge pulses from noise pulses or from partial discharges from external to the machine is difficult.

Figure 3:
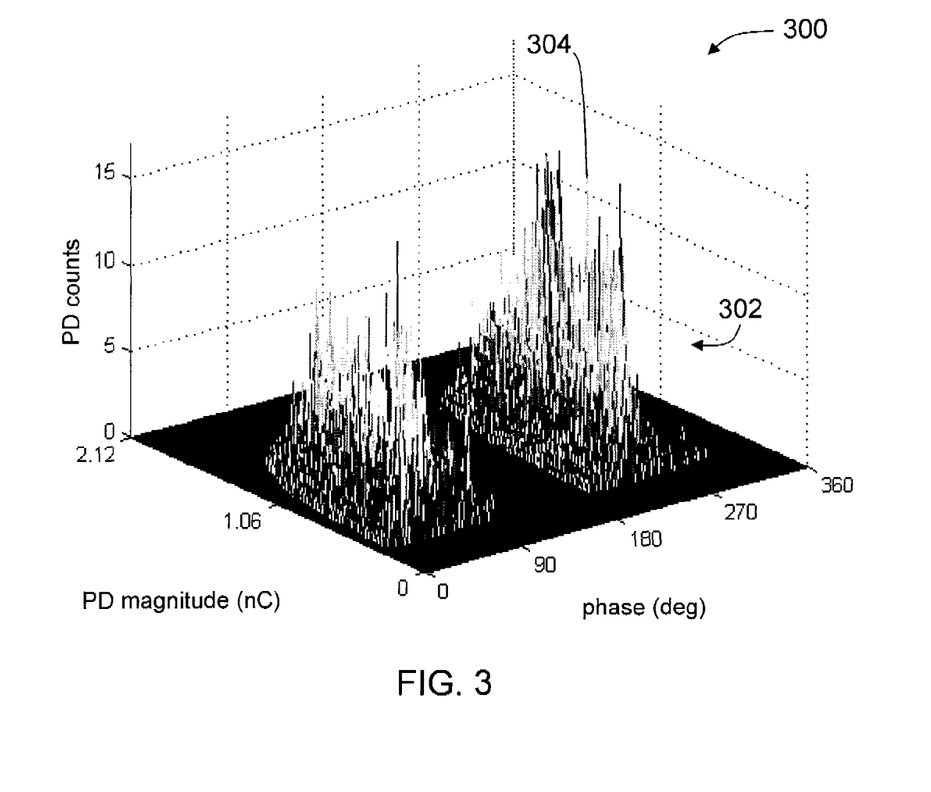
FIG. 3 is a graph of an exemplary phase-resolved histogram that may be generated from the phase-resolved PD pattern shown in FIG. 2.

FIG. 3 is a graph 300 of an exemplary phase-resolved histogram 302 that may be generated form the phase-resolved PD pattern (shown in FIG. 2). Histogram 302 illustrates the frequency of occurrence with respect to a pulse magnitude and phase in a 3-dimensional pattern. Similar to the phase-resolved PD pattern shown in FIG. 2, in the exemplary representation, determining true partial discharge pulses from noise pulses or from partial discharges from external to the machine is difficult.

Figure 4:
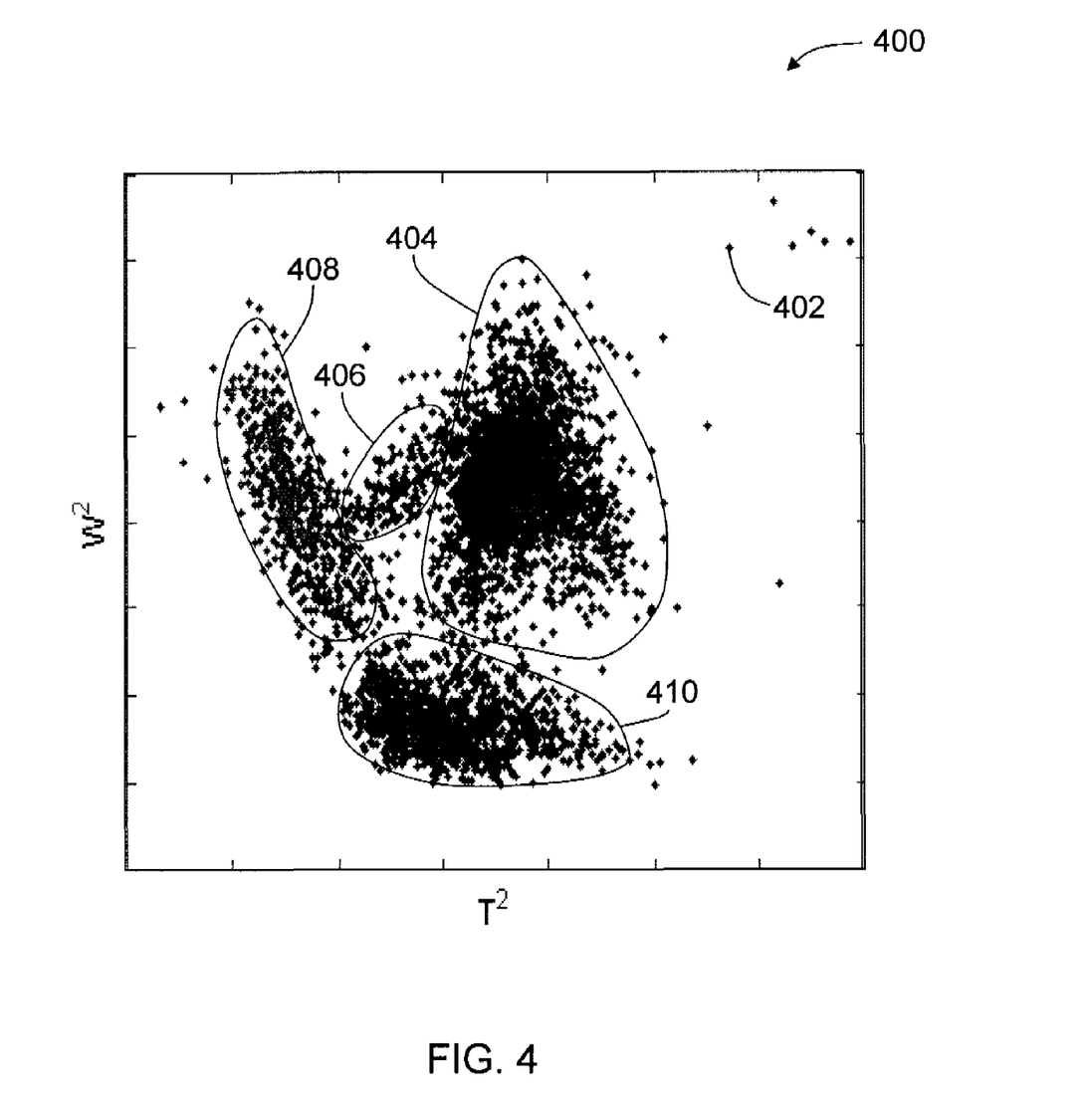
FIG. 4 is an exemplary classification map illustrating the results of the phase-resolved histogram transformed into the T-W domain.

FIG. 4 is an exemplary classification map 400 illustrating the results of phase-resolved histogram 302 transformed into the T-W domain. Each pixel on graph 400 corresponds to one of the plurality of pulses 304 illustrated on phase-resolved histogram 302. The pixels represent both partial discharge pulses and noise pulses. The pixels tend to cluster into groups 404, 406, 408, 410 of similar types of pulses, for example, noise pulses tend to exhibit similar characteristics as other noise pulse such that the noise pulse pixels tend to cluster. A cluster of pixels is identified for each type of pulse in the received plurality of pulses.

Separation and classification of the PD signals are performed using PD pulse shape analysis. In the exemplary embodiment, this process includes two steps: information extraction and classification. The extraction provides a mapping of the recorded pulses. The classification builds a certain number of clusters, according to the classification map, through a clustering algorithm that determines cluster boundaries using, for example, a centroid of the cluster shape, a standard deviation, a skewness, and a Kurtosis of the pixels such that a classification of PD pulses into clusters accomplished. Each cluster is characterized by homogeneous features of PD-pulse shape. For each acquired signal represented in the PRPD pattern, the equivalent time-length (T) and bandwidth (W) are calculated and mapped in the T-W graph 400. As used herein, kurtosis is a measure of the peakedness of the probability distribution of a real-valued random variable. Higher kurtosis means more of the variance is due to infrequent extreme deviations, as opposed to frequent modestly-sized deviations.

Because PD pulses generated at the same defect tend to exhibit similar shapes, the pixels representing these signals are located near each other in T-W map 400. Noise pulses are also similarly shaped or are not shaped very similarly to PD pulses, so that two classes can be identified by examining T-W map 400. The original pattern is separated into sub-patterns that include only the pulses relevant to each class such as PD and noise. The noise class is either rejected or retained for further analysis of the characteristics contained therein. Processing of PD pulses that include the same class characterized by homogeneous features of PD-pulse shape, may provide a first level defect classification of PD pulses. For example, the pulses may be classified as internal, surface, or corona discharges. The pulses are then processed further using rules that determine the particular shape of each pulse and correlate the shapes to particular defect types, location, and/or character. The features of each pulse used include, but are not limited to rise time, pulse width, spectral density, and statistical analysis of amplitude and phase distributions. The classification process evaluates PD phenomena even when clusters are not apparent in 3D patterns.

Figure 5:
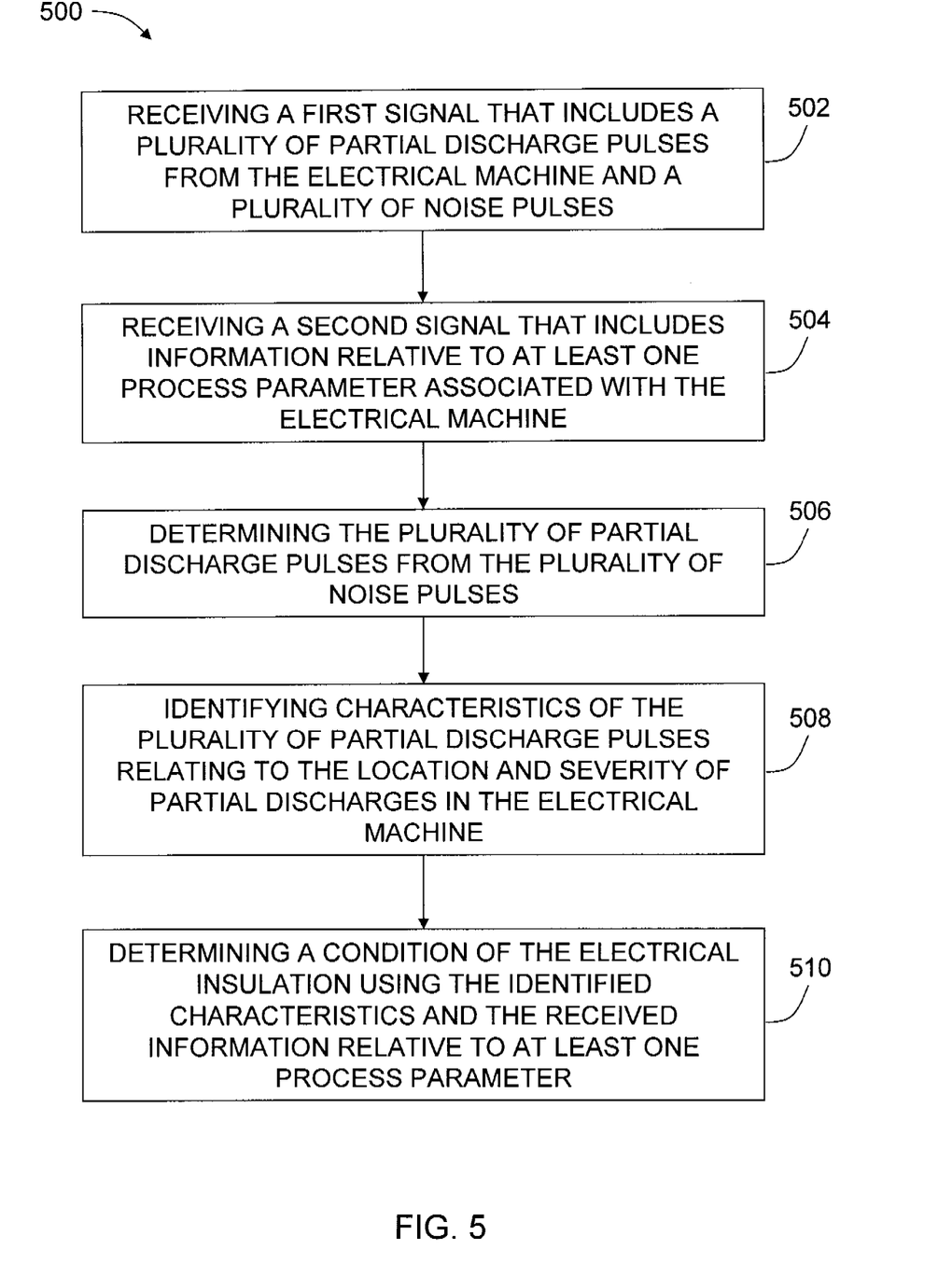
FIG. 5 is a flow chart of a method of analyzing electrical insulation in accordance with an embodiment of the present invention.

FIG. 5 is a flow chart of a method 500 of analyzing electrical insulation in accordance with an embodiment of the present invention. Method 500 includes receiving 502 a first signal that includes a plurality of partial discharge pulses from the electrical machine and a plurality of noise pulses. In the exemplary embodiment, a partial discharge sensor coupled to an electrical supply to or an electrical output from an electrical machine receives high frequency pulses from the electrical machine and from devices coupled to the supply. The high frequency pulses include partial discharge pulses from within the machine and partial discharge pulses from other components or devices coupled to the supply. The partial discharge pulses from within the machine are the pulses of interest, but the partial discharge pulses from components and devices external to the machine also includes valuable information regarding the health of those other devices. In some cases the partial discharge pulses from components and devices external to the machine are treated as noise and are discarded. In other cases the partial discharge pulses from components and devices external to the machine are further processed to extract the information they contain.

Method 500 also includes receiving 504 a second signal that includes information relative to at least one process parameter associated with the electrical machine. Different operating and environmental conditions affecting the electrical machine may influence the partial discharge onset voltage, frequency of occurrence, and shape of the pulses. Data indicative of these operating and environmental conditions is sampled and correlated to the first signal to provide a common baseline for evaluating the partial discharge pulses from the electrical machine.

The plurality of partial discharge pulses is determined 506 from the plurality of noise pulses. Partial discharge pulses generated in the same defect in the insulation are expected to have similar shape, phase and magnitude characteristics. By clustering pulses with similar characteristics together and separate from the pulses attributable to noise or partial discharge pulses from outside the electrical machine, the partial discharge pulses of interest can be selected and processed further.

Method 500 includes identifying 508 characteristics of the plurality of partial discharge pulses relating to the location and character of partial discharges in the electrical machine. Classifying the partial discharge pulses according to the location of origination of the pulses and the character of the pulses permits comparing the pulse characteristics to pulses from known defects from a similar machine or from a model of the electrical machine. Comparing the received pulses with the known or modeled pulses permits accurate partial discharge source identification. The condition of the electrical insulation is determined 510 using the identified characteristics of the pulses and the received information relative to at least one process parameter.

Figure 6:
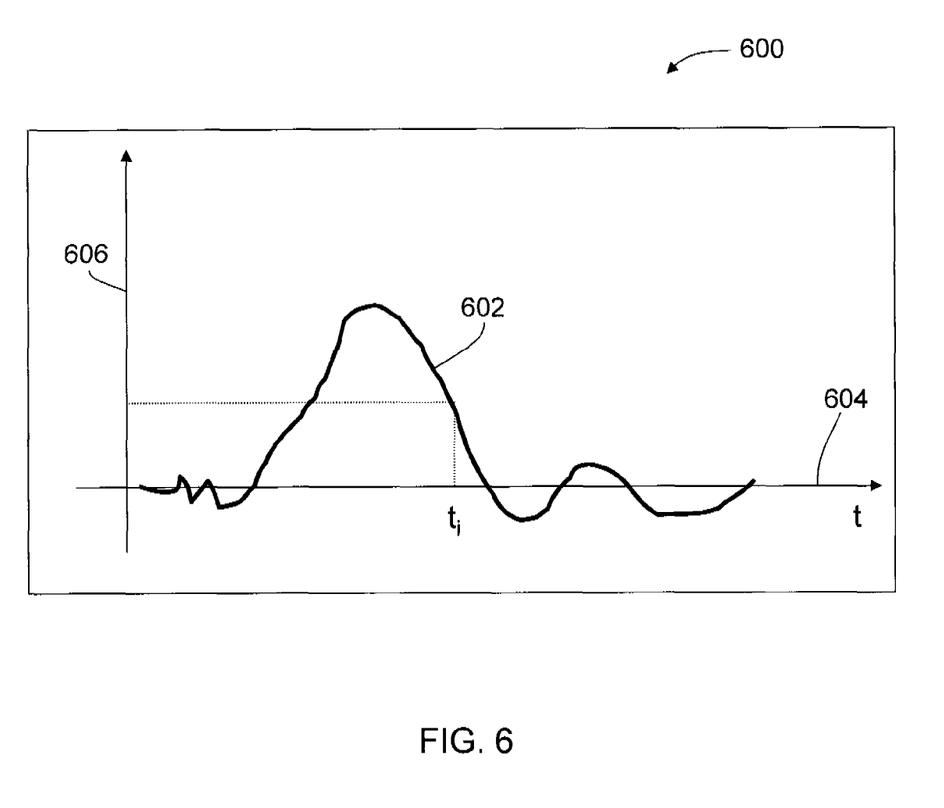
FIG. 6 is a graph that illustrates a trace of an exemplary pulse that may be detected by the analyzer system shown in FIG. 1.

FIG. 6 is a graph 600 that illustrates a trace 602 of an exemplary pulse that may be detected by analyzer system 100 (shown in FIG. 1). Graph 600 includes an x-axis 604 graduated in units of time (t) and a y-axis 606 graduated in units of pulse magnitude, for example, charge. In the exemplary embodiment, each pulse in a plurality of received pulses is analyzed for pulse characteristics that permit classification of the pulse according to similar pulse characteristics. Characteristics such as a mean of amplitudes, a standard deviation of amplitudes, a skewness of amplitudes, a kurtosis of amplitudes, a centroid of shape, 2nd order moment of shape, 3rd order moment of shape, and a 4th order moment of shape are determined for pulses received during both the positive and negative portions of the supply voltage. The characteristics are also determined with respect to phase angles and with respect to pulse magnitudes. Additionally, overall features of the plurality of pulses such as, but not limited to a maximum positive PD magnitude, a maximum negative PD magnitude, an overall mean of positive PD magnitudes, an overall mean of negative PD magnitudes, and a correlation between positive and negative PDs are determined.

Further, characteristics of the raw signal such as, but not limited to an alpha value, a beta value, a maximum peak of pulses, a minimum peak of pulses, a mean peak of pulses, and a standard deviation of pulse peaks are determined. Characteristics of the plurality of pulses in the TW domain are also determined. A graph of the TW domain is illustrated in FIG. 4. For example, an overall mean, a mean in T direction, mean in W direction, a standard deviation in T direction, a standard deviation in W direction, a direction of 1st eigenvector, a ratio of two Eigen values, a centroid of T distribution, a 2nd order moment of T distribution, a 3rd order moment of T distribution, a 4th order moment of T distribution, a centroid of W distribution, a 2nd order moment of W distribution, a 3rd order moment of W distribution, and a 4th order moment of W distribution are determined.

In the spectrum domain the x-axis is graduated in units of frequency rather than in units of time. Spectrum domain characteristics determined include, but not limited to a 1st frequency, a 2nd frequency, a 3rd frequency, a difference between 1st and 2nd frequencies, a difference between 1st and 3rd frequencies, an amplitude at 1st frequency, an amplitude at 2nd frequency, an amplitude at 3rd frequency, a difference between 1st and 2nd amplitudes, and a difference between 1st and 3rd amplitudes. These different frequencies characterize corona or partial discharges occurring in various locations within the stator winding insulation system or elsewhere outside the machine in locations such as isolated phase bus, insulators, bushings or transformer. An aging machine insulation may exhibit new activities at new frequencies or may see specific frequencies activity increase over time.

Additional characteristics that are determined include, but are not limited to an inception voltage, a partial discharge rate, a temperature of the machine and ambient, a humidity, vibration, flux probe signals, ozone levels, hydrocarbon concentration, protecting relaying device alarms, neutral current and voltage, field ground detector, hydrogen pressure, and a dew point.

In the exemplary embodiment, advanced PD interpretation using a single or double low frequency parameter diagnostics include for example, (i) An increase in PD) activity when the machine load is increased at a rapid rate indicates possible loose stator windings, (ii) A positive PD pulse predominance can indicate loose windings and stator bar surface corona, (iii) A combination of increasing ozone level and appearance of positive PD predominance is an indication of slot discharge activity and loose windings, (iv) an increase in ozone level with no PD positive predominance can be indicative of end-winding or grading corona.

Figure 7:
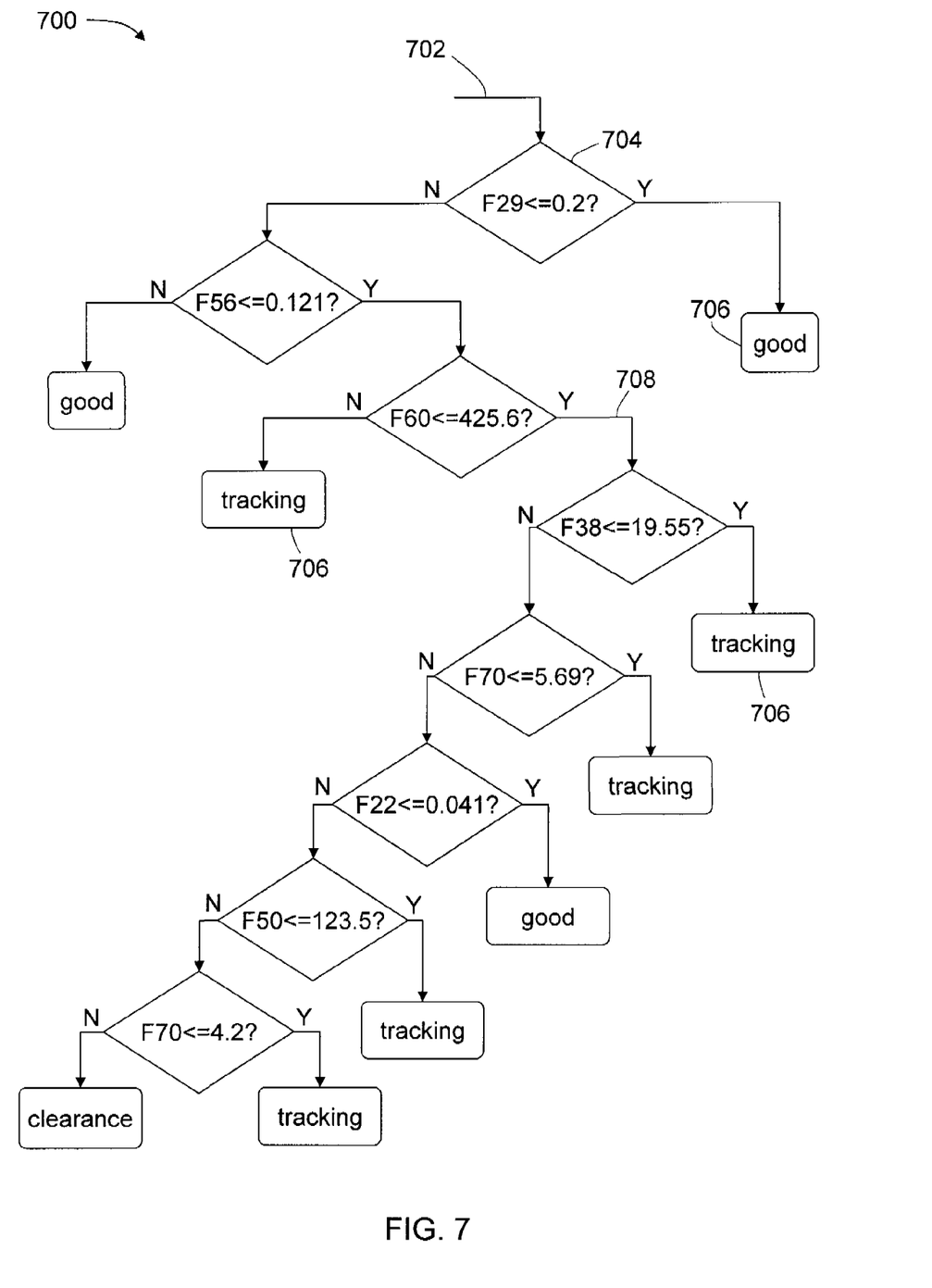
FIG. 7 is a flow diagram of an exemplary classification tree that may be used to classify pulses received by the analyzer system shown in FIG. 1.

FIG. 7 is a flow diagram of an exemplary classification tree 700 that may be used to classify pulses received by analyzer system 100 (shown in FIG. 1). Classification tree includes a plurality of decision blocks that are used to test characteristics of each pulse or a plurality of pulses until a final decision can be determined. Operating conditions of the electrical machine and environmental conditions are also tested using the classification tree. The characteristics of each pulse determined as described above are compared to threshold values or ranges of values in decision blocks of classification tree 700. In the exemplary embodiment, the specific values of each decision block and the operator, for example, a logical, an arithmetic, or other operator are stored in rule/model module 104.

In the exemplary embodiment, characteristics for a pulse or plurality of pulses enters classification tree 700 at point 702 and is evaluated in a first decision block 704, where a characteristic or feature F29 is compared to a value X29 that is a predetermined value that represents a threshold for characteristic or feature F29. In an alternative embodiment, the value X29 may be other values depending on the particular machine in a fleet of machines being evaluated, the type of machine being evaluated, for example, a transformer, a generator, or a motor. Similarly, other values described below may also be other values in other exemplary evaluations. Characteristic F29 represents a centroid of negative PD shape. Similarly, other characteristics are represented by alphanumeric codes, for example, F56 represents a maximum peak values of pulses, F60 represents an overall mean of TW map, F38 represents a 2nd order moment of PD shape (magnitude), F70 represents a 4th order moment of TW (in T direction), F22 represents a 2nd order moment of PD shape (phase), F50 represents a maximum PD (negative phase). Each decision block yields a result based on a rule that either is a determination 706 of the condition of the insulation or an uncertainty 708 that is then further tested in subsequent decision blocks. It is possible for several decision tree analyses to occur simultaneously such that a determination of the final results of a plurality of analyses would be made to determine the condition of the insulation and any recommendations for future operation and/or maintenance.

Additional characteristics that can be tested using classification tree 700 can be manually entered during operation of analyzer system 100. Such characteristics may be based on further empirical data that becomes available and/or derived results based on experience with the electrical machine.

The above-described methods and apparatus for analyzing electrical insulation of an electrical machine are cost-effective and highly reliable. The analyzer system receives process parameter information from plant sensors through a data acquisition system and partial discharge information that includes both partial discharge pluses and noise. The analyzer system separates the noise pulses from the partial discharge pulses and classifies the partial discharge pulses using the characteristics of each pulse. Similar pulse classes are evaluated using rules and/or a pulse model to determine a location and character of the partial discharge events. Data from a history of the electrical machine and/or other similar machines in a fleet of machines is used to facilitate the determination. The received process parameter information and partial discharge information are stored in a database for later analysis and/or processing.

While the invention has been described in terms of various specific embodiments, those skilled in the art will recognize that the invention can be practiced with modification within the spirit and scope of the claims.

What is claimed is:

1. A method of analyzing electrical insulation of an electrical machine comprising:
   receiving a first signal that includes a plurality of partial discharge pulses from the electrical machine and a plurality of noise pulses;
   receiving a second signal that includes information relative to at least one process parameter associated with the electrical machine and at least one parameter associated with the environment surrounding the electrical machine;
   determining the plurality of partial discharge pulses from the plurality of noise pulses;
   identifying characteristics of the plurality of partial discharge pulses relating to the location and character of partial discharges in the electrical machine;
   determining a cluster of points in a time-length (T) versus bandwidth (W) (WT) domain associated with the plurality of partial discharge pulses, wherein each point is representative of one of the plurality of partial discharge pulses or one of the plurality of noise pulses; and
   determining a condition of the electrical insulation using the identified characteristics and the received information relative to at least one of the process parameter and the environmental parameter.

2. A method in accordance with claim 1 wherein said receiving a signal that includes a plurality of partial discharge pulses from the electrical machine and a plurality of noise pulses comprises receiving at least one of a signal from a real-time sample from a partial discharge coupler connected to the electrical machine and a signal stored in a database.

3. A method in accordance with claim 1 wherein said receiving a second signal that includes information relative to at least one process parameter associated with the electrical machine comprises receiving a signal that includes information relative to at least one of voltage, current, real power, reactive power, temperature, vibration, a stator leak monitoring system (SLMS), flux probe signals, ozone levels, vibration, hydrocarbon concentration, protecting relaying device alarms, neutral current and voltage, field ground detector signal, hydrogen pressure, and combinations thereof.

4. A method in accordance with claim 1 further comprising generating a three dimensional histogram of the frequency of the magnitudes of phase resolved partial discharge pulses.

5. A method in accordance with claim 4 further comprising transforming the histogram to a time-length (T) versus bandwidth (W) map.

6. A method in accordance with claim 1 wherein determining a cluster of points in a time-length (T) versus bandwidth (W) (WT) domain comprises determining a cluster of points in the WT domain using at least one of a centroid, a standard deviation, a skewness, and a kurtosis of the cluster.

7. A method in accordance with claim 1 further comprising:
generating a phase resolved partial discharge pattern of the plurality of partial discharge pulses; and
identifying characteristics of the phase resolved partial discharge pattern that determines the shape of the plurality of partial discharge pulses.

8. A method in accordance with claim 7 further comprising:
grouping partial discharge pulses having similar characteristics; and
identifying a source of the grouped partial discharge pulses from characteristics of the grouped partial discharge pulses.

9. A method in accordance with claim 1 further comprising receiving at least one of the first and second signal in real time.

10. A method in accordance with claim 1 wherein the electrical machine is a process plant component, said method further comprising receiving the second signal from a plant-wide distributed control system.

11. A method in accordance with claim 1 further comprising:
storing at least one of the first and second signals in a database; and
associating the stored first signal with the stored second signal.

12. A method in accordance with claim 1 wherein said receiving a second signal that includes information relative to at least one environmental parameter associated with the environment surrounding the electrical machine comprises receiving a signal that includes information relative to at least one of ambient temperature, ambient humidity, and atmospheric pressure.

13. An apparatus for on-line location of partial discharge events in an AC power system during operation of the power system, said apparatus comprising:
a coupler, coupling during operation, to the AC power system and responsive to current flowing through the AC power system, said coupler further detecting high frequency electromagnetic pulses in the AC power system generated by partial discharge events; and
an analyzer system, receiving during operation, a first signal representative of the detected high frequency electromagnetic pulses and a second signal representative of at least one process parameter associated with the operation of the AC power system during operation of the power system and at least one parameter associated with the environment surrounding the AC power system, said analyzer system further determining a cluster of points in a time-length (T) versus bandwidth (W) (WT) domain associated with the plurality of partial discharge pulses, wherein each point is representative of one of the plurality of partial discharge pulses or one of the plurality of noise pulses, and determining a location of partial discharge events in the power system using at least one of the first and second signals.

14. An apparatus in accordance with claim 13 wherein said analyzer system, during operation, is communicatively coupled to a data acquisition system to acquire at least one input from a process parameter sensor and generate at least one said second signal.

15. An apparatus in accordance with claim 13 wherein said analyzer system, during operation, receives from a memory a first signal representative of high frequency electromagnetic pulses and a second signal representative of at least one process parameter associated with the operation of the AC power system and at least one parameter associated with the environment surrounding the AC power system.

16. An apparatus in accordance with claim 13 wherein said analyzer system, during operation, time-stamps said received signals.

17. An apparatus in accordance with claim 13 wherein said analyzer system, during operation:
determines time-based and frequency based characteristics of each pulse and a plurality of pulses in the first signal;
compares the determined characteristics to known characteristics of pulses and pluralities of pulses, the known characteristics being stored in a memory communicatively coupled to said analyzer system; and
determines a location and character of partial discharge events based on the comparison and the second signal.

18. An electrical machine monitoring system comprising:
a coupler, coupling during operation, to an AC power system and responsive to current flowing through the AC power system, said coupler further detecting high frequency electromagnetic pulses in the AC power system generated by at least partial discharge events and to output a first signal representative of the high frequency electromagnetic pulses;
a data acquisition system, acquiring during operation, at least one input from a plurality of process parameter sensors associated with the operation and the environment of the AC power system and outputting a second signal representative of the plurality of process parameter sensors; and
an analyzer system, receiving during operation, the first signal and the second signal, said analyzer system further determining a cluster of points in a time-length (T) versus bandwidth (W) (WT) domain associated with the plurality of partial discharge pulses, wherein each point is representative of one of the plurality of partial discharge pulses or one of the plurality of noise pulses, and determining a location of partial discharge events in the power system using the first and second signals.

19. An apparatus in accordance with claim 18 wherein said analyzer system, during operation:
time-stamps the received first and second signals;

stores the time-stamped first and second signals in a memory communicatively coupled to said analyzer system; and receives from the memory the first signal and the second signal.

20. An apparatus in accordance with claim 18 wherein said analyzer system, during operation:

determines time-based and frequency based characteristics of each pulse and a plurality of pulses in the first signal;

compares the determined characteristics to known characteristics of pulses and pluralities of pulses, the known characteristics being stored in a memory communicatively coupled to said analyzer system; and determines a location and character of partial discharge events based on the comparison and the second signal.

* * * * *